United States Patent [19]

Middelman

[11] Patent Number: 5,874,152
[45] Date of Patent: Feb. 23, 1999

[54] METHOD OF MAKING A COMPOSITE LAMINATE AND A PWB SUBSTRATE SO MADE

[75] Inventor: Erik Middelman, Arnhem, Netherlands

[73] Assignee: AMP-AKzo Linlam VoF, Arnhem, Netherlands

[21] Appl. No.: 682,518

[22] PCT Filed: Jan. 25, 1995

[86] PCT No.: PCT/EP95/00273

§ 371 Date: Jul. 25, 1996

§ 102(e) Date: Jul. 25, 1996

[87] PCT Pub. No.: WO95/20475

PCT Pub. Date: Aug. 3, 1995

[30] Foreign Application Priority Data

Jan. 26, 1994 [EP] European Pat. Off. .............. 94200192

[51] Int. Cl.$^6$ ...................................... B32B 9/00
[52] U.S. Cl. .......................... 428/105; 428/107; 428/113; 428/114; 428/137; 428/195; 428/209; 428/360; 428/408; 428/473.5; 428/901; 361/748; 361/751; 361/792; 156/166; 156/169; 156/174; 156/176; 156/233; 156/269; 156/273.3; 156/307.7; 156/324
[58] Field of Search ...................................... 428/107, 105, 428/137, 114, 209, 360, 408, 195, 473.5, 113, 901; 361/748, 792, 751, 750; 156/174, 166, 169, 176, 233, 269, 273.3, 307.7, 324; 264/137, 258; 174/256; 442/378

[56] References Cited

U.S. PATENT DOCUMENTS

| | | | |
|---|---|---|---|
| 4,814,945 | 3/1989 | Leibowitz | 361/414 |
| 4,943,334 | 7/1990 | Medney et al. | 156/174 |
| 4,980,217 | 12/1990 | Grundfest et al. | 428/113 |
| 5,037,691 | 8/1991 | Medney et al. | 428/137 |
| 5,330,595 | 7/1994 | Held | 156/64 |
| 5,496,613 | 3/1996 | Middelman et al. | 428/105 |

FOREIGN PATENT DOCUMENTS

| | | | |
|---|---|---|---|
| 0 309 982 | 4/1989 | European Pat. Off. | C08J 5/24 |
| 0 478 051 | 4/1992 | European Pat. Off. | B29C 67/14 |
| 0 530 450 | 3/1993 | European Pat. Off. | B29C 43/30 |
| 63 117 053 | 5/1988 | Japan | B32B 27/04 |
| 1 283 996 | 11/1989 | Japan | H05K 3/46 |
| WO92/22191 | 12/1992 | WIPO | H05K 1/03 |
| WO92/22192 | 12/1992 | WIPO | H05K 3/46 |

OTHER PUBLICATIONS

Int'l Search Report in PCT/EP95/00273 dated Jun. 2, 1995.
Chemical Abstracts 114:25517, "Polymer–Fiber Composites as Dielectrics and Their Manufacture", Sep. 1990.

Primary Examiner—Frederick Krass
Attorney, Agent, or Firm—Loretta A. Miraglia; Dilworth & Barrese

[57] ABSTRACT

The invention relates to a method of making a composite laminate comprising the steps of providing unidirectionally oriented parallel fibres (UD filaments) (3) with a resin matrix to form a composite UD layer and laminating a plurality of UD layers to form a UD crossply laminate (18). In the method of the invention, the UD filaments are impregnated with a melt of a resin which in the uncured form solidifies below a certain temperature (Tm). Thereupon the UD filaments-containing resin is cooled to a temperature below Tm to produce the composite UD layer. The produced composite UD layer is irreversibly cured before or after lamination. Notably latent curing resins are suitable. The impregnation is preferably conducted by coating a process belt (8) with solid resin (6), laying the UD filaments onto the resin, and heating the resin so as to form the resin melt. The heating of the resin is preferably conducted by means of IR irradiation (11).

20 Claims, 1 Drawing Sheet

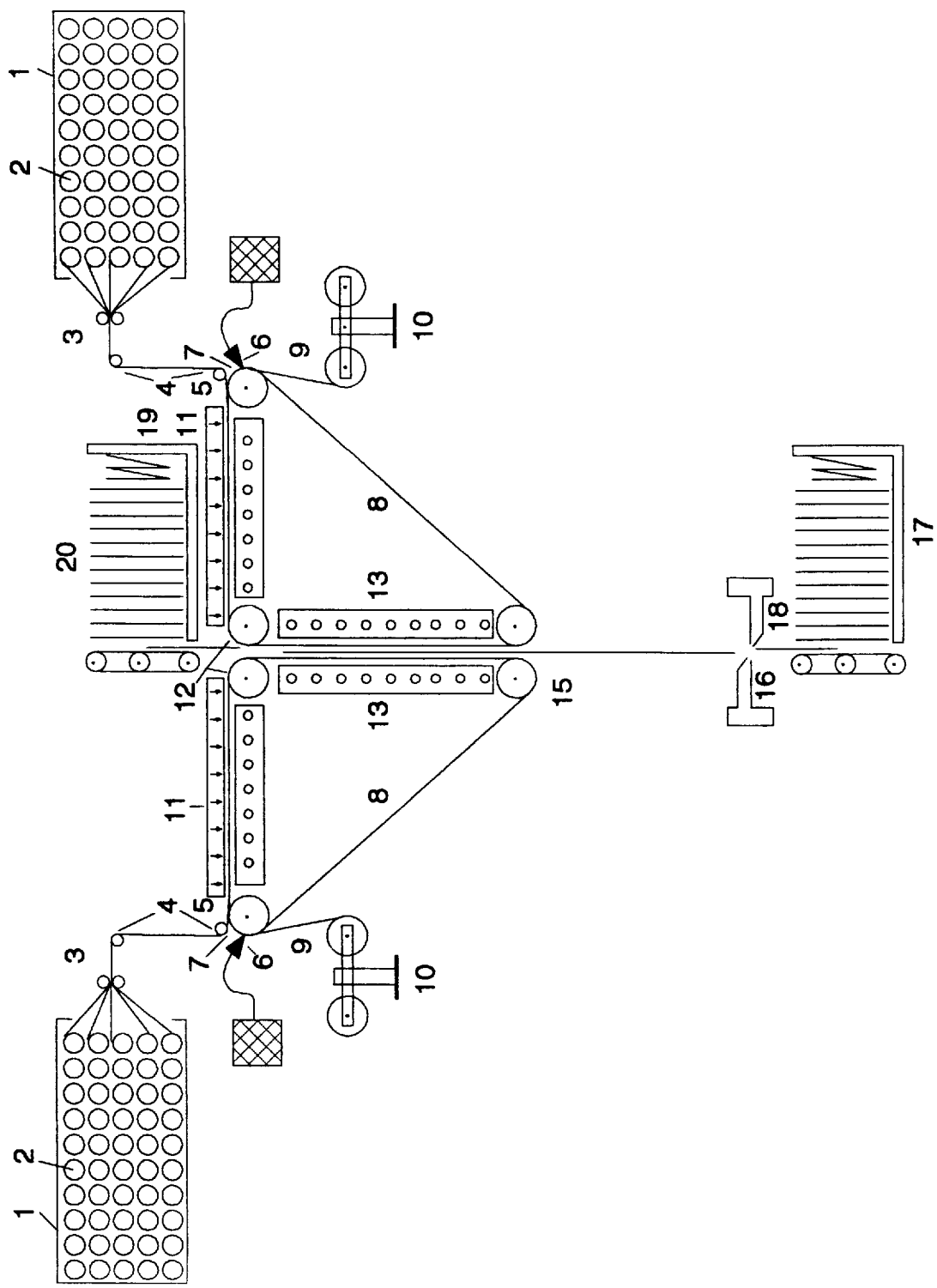

METHOD OF MAKING A COMPOSITE LAMINATE AND A PWB SUBSTRATE SO MADE

The invention is in the field of printed wire board laminates and pertains to a method of making such a laminate comprising the steps of providing unidirectionally oriented parallel fibres (UD filaments) with a matrix material to form a composite UD layer and laminating a plurality of UD layers to form a UD crossply laminate. The invention also pertains to the resulting UD crossply PWB laminate.

BACKGROUND OF THE INVENTION

The term UD crossply laminate is used to indicate composite laminates of the known type with a plurality of layers of unidirectionally oriented parallel fibres (UD filaments) contained in a resin matrix, the UD filaments being arranged in different layers of crossing orientational directions, said layers being symmetrically positioned vis-a-vis a plane of symmetry through the centre of the laminate which runs parallel to its outer surfaces.

UD crossply laminates possess considerable advantages such as an improved surface quality, a comparatively low linear thermal coefficient of expansion (TCE) in the x and y directions, the option of incorporating a high content of fibres, and a favourable dimensional stability. In these respects UD crossply laminates are pre-eminently suitable as PWB substrate.

Such UD crossply PWB laminates are known from, int.al., U.S. Pat. No. 5,037,691 (Medney). The disclosed PWBs are manufactured by winding filaments about a square flat mandrel in several layers crossing at an angle of 90°, with the filaments being provided with curable matrix material by means of injection and/or impregnation. The matrix, which in consequence contains crosswise-applied layers of UD filaments, is then cured.

Other manufacturing methods in accordance with the above opening paragraph have been described in U.S. Pat. No. 4,814,945 (Leibowitz), EP 478 051, and WO 92/22191.

Leibowitz's disclosure relates to a PWB laminate comprising a matrix resin reinforced with parallel aramid fibres. The laminate is built up from layers of unidirectional aramid tape applied one on top of the other in crosswise fashion. The aramid tape is made by arranging a single layer of parallel aramid fibres to form fibre strips, coating the fibre strips with resin, and heating them to a semi-cured or "B"-stage.

EP 478 051 discloses the continuous manufacture of a flat substrate from a fibre-reinforced matrix, which process comprises the use of at least two moving layers of parallel, rectilinearly extending reinforcing fibres not bonded in the form of a woven fabric (UD fibres), providing said UD fibres, which are positioned in at least two crossing directions, with matrix material, and passing them through a laminating zone, for instance a double belt press, to form a crossply laminate.

In WO 92/22191 method of manufacturing a PWB laminate is described involving the steps of making non-flowable UD layers, coating at least part of the non-flowable UD layers with an adhesive on one or both sides, crosswise stacking the UD-layers in such a way that there is at least one layer of adhesive between each pair of UD-layers having a different direction of orientation, and bonding the stacked UD-laminates by activating the adhesive layers.

A general problem in the manufacture of UD crossply PWB laminates has to do with the step of providing the UD filaments with matrix resin. In order to fully benefit from the advantages of UD crossply laminates, the UD filaments should be orderly distributed over each UD layer. Problems may arise if portions of the filaments are not coated with matrix resin or if large resin areas are devoid of reinforcement. These problems include the occurrence of sink marks (highly undesirable surface unflatnesses due to differences in thermal expansion of portions of the laminate having different fibre volume fractions) and, in the case of PWBs made by additive plating, the occurrence of short circuits due to voids having become plated. This calls for an improved impregnation technique.

Another problem that particularly applies to the manufacture of UD-crossply laminates is that of disorientation of the UD filaments. In order to obtain a laminate having sufficient flatness, which is a property of particular importance to a PWB laminate, proper orientation must be retained. UD orientation is in jeopardy particularly when the resin is flowable under the conditions of lamination. For, on account of the flow which occurs during lamination, the tension, and hence the orientation of the UD layers, cannot be adequately controlled.

For economical and other reasons it is generally desired that UD crossply laminates can be made in a fast process. At the same time, such a process should be slow enough to allow proper impregnation to occur, and the resin should be sufficiently cured so as to have lamination under non-flow conditions. To this end it is known to employ fast curing resins that display good flow characteristics prior to curing. These usually are low-viscous, highly reactive resins. While the use of these resins may give a faster process than conventional resins, the high reactivity, and the consequently short potlife, can easily lead to curing at undesired stages in the process. E.g., curing will occur in the applicator unit in which the resin is held prior to its application onto the processing belt, or there is the danger of curing having proceeded too far before lamination, which is a disadvantage in that the strongest adhesive bonds between two UD layers are formed during lamination when at least one of the layers has not been fully consolidated.

As background art in the area of resins, not dealing with the manufacture of printed wire board laminates on the basis of UD filaments, int.al. EP 530 450 can be mentioned. This disclosure pertains to the continuous production of resin-impregnated materials by means of a double belt press. The resin is applied either via an extruder or, in the case of solid flakes, via a sprinkler. Further background art is JP 63/117053, which pertains to a thermosetting resin composition for printed circuit board laminates, which provides non-tacky prepregs by virtue of its melting point being above room temperature.

SUMMARY OF THE INVENTION

The present invention aims at avoiding the above problems, and consists in that in a process of the aforementioned known type the UD filaments are impregnated with a resin which solidifies below a certain temperature (Tm), the impregnation being conducted at a temperature above Tm, whereupon the UD filaments-containing resin is cooled to a temperature below Tm to produce said composite UD layer, the produced composite UD layer being irreversibly cured before, during, or after lamination, which lamination is conducted under non bulk-flow conditions.

The latter means that lamination is conducted under such conditions that any flow which occurs is not of such an extent as will lead to displacement of filaments and resin in the x-y plane. Such "bulk" or "macro" flow would lead to undesired disorientation of the UD filaments. It should be noted that "micro" flow, i.e. local slight flowing of the resin at the UD layer's surface, in the y-z or x-z plane, will generally occur, and is in fact desired for obtaining good adhesion during lamination.

It should be noted that, with the produced composite UD layer being irreversibly cured, the process of the invention differs from processes employing thermoplastic resins in that the latter have the drawback that heat may lead to flow, so that additional measures have to be taken in order to avoid disorientation of the UD filaments. If the irreversible curing of the produced composite UD-layers is not effected until the lamination stage, care should be taken that the lamination temperature does not rise to above the softening point (Ts) of the resin in order to retain non bulk-flow conditions. In the uncured state, Ts is identical with Tm. When curing proceeds, the increased interlinking of molecular chains, proceeding through the gel stage, will lead to a gradual increase in Ts. This means that in the case of curing during lamination, lamination may be conducted with gradually increasing temperature, it being preferred that the gradually increasing temperature be constantly kept below Ts, say 5–10K, as long as the gel point has not been reached. Above the gel point, when a stage of irreversible curing has in fact been achieved, further curing may be conducted at any temperature below the degradation temperature of the resin. The same type of temperature run can be employed if curing is conducted after lamination.

It is preferred that Tm is about ambient temperature (room temperatures. Favourable resins that are solid at ambient temperature and that cure at a temperature above the impregnation Temperature, but below the softening point, are latent-curing resins. These are known in the art, and usually comprise high molecular weight and/or rigid polymer chains and a latent-curing agent which can be activated at the desired stage, e.g. by heat. In the latter case, activation will generally be at a temperature above Ts. In order to avoid heating above Ts leading to disorientation of the UD filaments, activation of such a hardener and curing will be done in a separate step, after lamination. Lamination, which is critical in respect of retaining proper orientation, is performed at a temperature below Ts.

The requirement of lamination under non bulk-flow conditions may also be satisfied without special regard for the type of resin chosen, as long as the lamination process itself is appropriately chosen. Thus, if the lamination is conducted in an autoclave under isobaric conditions, or in a vacuum bag, bulk flow will not occur.

It is preferred that in the impregnation stage the heating of the solid, uncured resin be conducted through non-contact heating means, particularly by IR irradiation. This allows for faster heating and cooling steps as compared with the conventional method of heating the surface onto which the resin is applied (the process belt), since it is only the resin and fibres volume that needs to absorb and give off heat, respectively. Thus, rapid heating of the resin means that the impregnation of the UD filaments can be conducted in a relatively short processing step (say, less than 1 second), while the impregnated UD filaments will be allowed to cool down rapidly to below the resin's Tm, thus forming a composite UD layer. Further, this heating method leads to a lower consumption of energy in the process.

The preferred way of carrying through lamination, particularly in conjunction with the above non-contact heating method, involves applying on a surface (e.g. the process belt or copper foil) a layer of solid resin. This application of the layer of solid resin may be done by applying the resin at a temperature below Tm (in the form of, e.g., powder or flakes), or to apply it as a melt (e.g. by extrusion coating) and then cool it to below Tm. After the layer of solid resin has thus been applied, the UD filaments are laid onto it, and the resin is heated to above Tm to form a resin melt, which impregnates the UD filaments. Apart from being a fast and convenient impregnation method, this method has the advantage that there is a thin film of solid resin in between the process belt and the UD filaments. Since in the resulting PWBs there will not be any direct contact between the circuitry (copper) and the filaments, electromigration is prevented.

Furthermore, the thin film of solid resin serves to overcome the problem of portions of the filaments sticking to the process belt (a typical problem incurred when forming UD composites, since unlike woven fabrics, in which the warp and weft fibers keep each other in place, the individual UD filaments are not held together).

A further practical advantage of the method of the present invention to be noted is that the processing speed is independent of resin reactivity. For, processing speed is not gained by faster curing but determined by the rate of impregnation, particularly by the cooling rate of the UD-filaments containing resin. As a rule, it is easier to control heating and cooling rates than the rate of a chemical reaction such as a curing reaction.

BRIEF DESCRIPTION OF THE DRAWING

The FIGURE shows a cross section parallel to the machine direction of a device with which a process in accordance with the present disclosure may be carried out.

DETAILED DESCRIPTION OF THE INVENTION

Hereinafter an explanation is given of the process in which the above method of forming composite UD layers and UD crossply laminates is preferably employed, viz. a method of manufacturing a composite laminate, in which UD filaments are provided with not yet consolidated matrix material and passed through a laminating zone in layers of at least two different orientational directions, and the matrix material is consolidated, with the UD filaments provided with not yet consolidated matrix material being passed through the laminating zone together with a pre-formed, non-flowing UD composite. In accordance with the present invention, the preformed, non-flowing composite is made using a method as described above. Preferably, the UD filaments are provided with matrix resin by means of the above-described impregnation technique. The term "not yet consolidated matrix material" then refers to the aforementioned resin at the impregnation temperature above Tm.

The orientational direction of the reinforcing fibres in the preformed, non-flowing UD composite is different from the orientational direction of the fibres provided with matrix material with which it is laminated. For obtaining a UD-reinforced laminate having the desired orthotropic properties, it is preferred to have the two orientational directions mutually perpendicular to each other. With a view to practicability it is preferred for the orientational direction of the fibres which are provided with matrix material to be equal to the machine direction during the laminating process.

As has long been known, UD crossply laminates preferably are balanced and symmetric. The term "balanced"

indicates equal properties in perpendicular directions (e.g. an equal number of filaments in the x and y directions), the term "symmetric" indicates mirror image symmetry across the thickness of the laminate, i.e., the laminate is mid-plane symmetric. In order to produce such a balanced and symmetric laminate the method of the invention can be carried out advantageously in symmetric fashion, i.e., by so feeding the UD fibres provided with not yet consolidated matrix material that they are positioned on both sides of the non-flowing UD composite, the term "sides" indicating the outer surfaces of the non-flowing UD composite (which generally is in the form of a thin, flat panel).

More particular preference is given to the laminate being so composed that the UD-reinforced layers are oriented as specified in one of the following models, with 0° and 90° standing for orthogonal orientational directions and the relative thickness of the layers being indicated by repeating the given orientation where necessary:

0°/90°90°/0°
0°/90°90°/0°0°/90°90°/0°.

In general, for utilisation in PWBs the UD-reinforced layers in the laminate according to the invention will each have a thickness in the range of 6 to 800 µm, preferably of about 12.5 to 400 µm.

Further, the process according to the invention may be repeated number of times. In that case, instead of the non-flowing UD composite being employed, use is made in each subsequent laminating step of a non-flowing material, usually a crossply laminate, such as manufactured in the manner taught hereinbefore. In the process according to the invention the non-flowing crossply laminate should be passed through the laminating zone in such a direction as will give a balanced and mid-plane symmetric laminate. It is also possible to employ a metal layer, e.g. a thick copper foil of about 18–210 µm, as the non-flowing material that is passed trough the laminating zone. This results in a PWB laminate having an inner layer of metal that may serve as a power or ground plane, or as a heat-sink.

In general, it is advisable to post-cure the composite laminate manufactured by a process according to the invention after the final laminating step, in order to ensure full conversion in all layers. The post-cure is preferably conducted under isobaric conditions or at a curing temperature that constantly remains below Ts.

A major advantage of manufacturing a non-flowing composite panel reinforced with UD fibres in a first step is that it is not necessary to keep the UD fibres under tension throughout the entire manufacturing process, since the non-flowing matrix material conserves the required orientation. As compared with the prior art, the process according to the invention thus provides easier and superior conservation of the orientation which is so vital to the manufacture of flat UD fibre-reinforced composites.

According to the invention, the use of a double belt press is preferred for obtaining the UD composite. The resin is coated onto the processing belt(s), and heated - preferably using non-contact heating means to form a resin melt. The UD filaments are laid onto the resin, possibly after the resin melt has been formed, but preferably prior to the heating step. This impregnation stage may be followed by a lamination stage, in which two layers of UD-filaments impregnated with resin (supplied by each of the two processing belts of the double belt press) are joined in a portion of the machine which can be defined as a laminating zone. Thereupon, the UD filaments provided with resin are guided along a cooling zone, which may simply consist of a length of the processing belt sufficient to allow the resin to give off sufficient heat so as to reach a temperature below Tm. Particularly in the case of the heating step involving non-contact heating means the required length of the processing belt may be very short (e.g about 3 m, having a. working length of about 1 m). After having passed the cooling zone, the UD-filaments are held fixed in a non-flowing resin, i.e. the non-flowing UD-composite has been formed. If so desired, the process may be repeated to obtain a thicker UD composite, in which case the UD composite prepared earlier is introduced into the double belt press and laminated with UD fibre-containing, not yet consolidated matrix material, such that the orientation of the UD fibres in the earlier formed UD composite equals the machine direction.

To form the final composite laminate one or more layers of the pre-formed flat, non-flowing UD composite should be laminated with the UD fibre-reinforced matrix material in such a way that the orientational direction of the fibres in the already pre-formed UD composite is different from the orientational direction of the fibres provided with matrix material which are laminated with the UD composite. Preferably, the orientational directions are perpendicular to each other and, as indicated above, a balanced and mid-plane symmetric laminate is provided. Depending on the number and order of UD layers over the thickness of the laminate, the plane of symmetry, which runs through the centre of the laminate and is parallel to the laminate's outer surfaces, either is the boundary between two UD layers, or it is an imaginary plane running through one UD layer, A balanced and mid-plane symmetric laminate provided with crosswise applied UD-reinforced layers is known as a UD crossply laminate. A major advantage of such a UD crossply laminate consists in the isomorphism of its properties in the x and y directions (i.e., the two fibre directions perpendicular to each other).

To further reduce the quantity of any waste material formed at the edges it may be advantageous in a process according to the invention when employing an isobaric double belt press to have a thermoplastic polymer which will also deform under isobaric conditions carried along at the edges of the material passed through the double belt press (e.g., by extrusion). The thermoplastic polymer preferably has a thickness equal to that of the product made. The positive effect of such a technique is that any bending out of the press bands that may occur at their edges (giving a strip of thinner product which has to be cut off) will be forced into the polymeric edge material, thus substantially reducing the amount that needs to be cut off of the material leaving the double belt press. An additional advantage is that it is possible to manufacture products of differing widths in a single double belt press without creating more waste material at the edges than when the press is set for just one product width. Further, in the embodiments of the process according to the invention in which copper foil is carried along, there is no need for the projection of several centimeters' width of copper foil, as is required in known processes. In this manner substantial materials cost savings are attained. A drawback to The conventional processes, moreover, is that matrix material running out at the edges may be caught between the copper foil and the laminating belts. The adhesion of the matrix material to the copper and/or the belts which occurs under such circumstances will detrimentally affect the surface quality of material produced in such a fouled laminating zone. Hence it is preferred according to the invention to carry a poorly adhering polymer along at the edges.

As was mentioned hereinbefore, the method according to the invention notably serves to manufacture substrates for PWBs. Onto such substrates a conductive material is applied, usually in the form of copper traces. In general, the application of these traces may be via a subtractive or an additive method. When using the former a layer of metal foil is applied onto at least one of the outer surfaces of the PWB substrate. Next, using known techniques the metal foil is removed by etching in such a way as to give the desired pattern of traces. Foils which are suitable for use in the subtractive forming of conductive traces notably are composed of copper, nickel or gold. When the additive method is employed, the laminate is immersed in an electroless copperplating bath. In aid of this technique the laminate is to be rendered catalytic for the (redox) reaction in such a bath at the sites where there needs to be copper buildup. In actual practice, the entire laminate is rendered catalytic at least at the surface and in the holes to be copperplated, while the sections which are not to be copperplated are covered with, say, a photosensitive resin.

The conductive material, or a catalytic layer, may be applied onto the laminates of the invention in any suitable manner, e.g., by providing the laminate with glue and adhering copper foil to it. In this respect the present invention also pertains to the use of a composite laminate made by any method in accordance with the foregoing description for manufacturing a printed wire board. It is preferred, however, to directly manufacture a laminate adapted to be used as a PWB, which the method according to the invention advantageously permits. Thus, the invention allows for the manufacture of laminates for both types of metallisation, either by the co-lamination of copper foil in a laminating step or by the addition to the matrix material of an additive which catalyses electroless copperplating. In addition, a coating which is catalytic to electroless copperplating may be applied either on-line or off-line. Such generally rubber-modified coatings are known to the person of average skill in the art and are commonly referred to as "additive adhesives," even though it is not a question of an actual adhesive so much as of a peel strength enhancing primer. The process according to the invention may involve off-line roll to roll adhesive coating, but also allows for the advantageous application of such a primer on-line with the final laminating step. In embodiments which involve the use of a double belt press with pacified steel belts, it is possible to provide the steel belts with copper, e.g. galvanically, which after lamination will come off the belts and adhere to the laminate surface, which preferably has been made subject to an adhesion promoting treatment.

It may be useful to provide an actual adhesive layer on composite materials such as those to which the invention relates. One such application regards the manufacture of multilayer PWBs (MLBs). MLBs comprise at least three layers of conductive material (copper traces). Generally, two of these conductive layers are to be found on the outer surfaces of the MLB, at least one conductive layer consequently being present in an inner plane. All circuit layers in an MLB need to be separated from each other by a dielectric (i.e. an electrically insulating layer). While in conventional MLBs such a dielectric is a woven-fabric reinforced prepreg (glass-epoxy prepreg), the composite laminates made in accordance with the present invention are highly suitable for use as insulating panels that can serve as dielectrics in MLBs. The manufacture of MLBs, for which the composite materials according to the invention are pre-eminently suitable, may comprise the PWBs and any intermediate uncoated substrates being bonded one on top of the other. To this end adhesive layers can be applied onto either the insulating panels, or the PWBs, or both. It is preferred that the adhesive be provided on the insulating panels.

Copper clad laminates, as well as laminates for additive plating, may also be provided— by coating or lamination, in-line or off-line -with a photosensitive layer (photoresist) such as commonly used for the subtractive formation of a circuit pattern.

When manufacturing composite materials provided with an adhesive layer on either outer surface an advantageous embodiment of the process according to the invention consists in that the double belt press is set up in such a way that the fibres and the matrix material are in a horizontal plane during the steps preceding lamination, this to prevent gravity from exerting different influences on the two product sides. An additional advantage is that it is possible in such a set-up to keep the machine direction such that the aforementioned optional coating of the product as it is removed from the laminating zone takes place vertically, with the machine direction equalling the gravitational direction.

Alternatively, the product made by the process according to the invention (UD composite, cross-ply laminate) may be subjected to a surface treatment to improve adhesion. Such treatments, e.g., the corona treatment and the low pressure plasma treatment, are known. They are best carried out downstream of the laminating zone and prior to any coating being applied.

It may be advantageous to pre-treat the belts in the laminating zone with a release agent. Release agents are known and are found primarily in two forms, Die., those that transfer to the material guided through the laminating zone, and those that do not. The latter are preferred, though use may be made with advantage of the former if a surface treatment such as described above is to follow, since any transferred release agent may be removed during such a treatment. Alternatively, to prevent adhesion to the belts in the laminating zone a release foil may be carried along, or the matrix resin may be provided with an internal release agent.

The invention further relates to a PWB substrate such as may be obtained using the process disclosed hereinbefore. At issue, in other words, is a substrate composed of a composite laminate which on at least one side has a surface adapted to PWB manufacture comprising matrix material with unidirectionally oriented reinforcing material embedded therein, such that the UD reinforcing material is present in several layers of crossing orientational directions, and the layers are symmetrically positioned vis-a-vis a plane of symmetry passing through the centre of the laminate parallel to its outer surfaces. PWB substrates according to the invention are characterised in that the matrix material is an irreversibly cured thermoset resin of a type which in the uncured form is solid at ambient temperature and flowable when heated.

The products manufactured by the process according to the invention have as an advantage that the internal stresses within the product are lower and more evenly distributed than is the case in comparable products, such as those known from EP 478 051 and U.S. Pat. No. 4,943,334. The known products were made using methods requiring UD fibres of at least two orientational directions to be kept under tension. This gives rise to a higher stress level than in the process according to the invention, in which, each time, the tension in a single direction is fixed by curing the matrix material to such a degree that it will not be brought to flow again. It is of importance to have low internal stress in a laminate. Needless to say, it is a prerequisite that all this stress should not exceed the Euler buckling limit. However, it is also of importance for the internal stress not to be too close to this limit, since additional stresses conceivably introduced in the course of further processing of the laminate would render the material unstable, so increasing the risk of buckling. A further advantage of the products according to the invention consists in the properly homogeneous distribution of the internal stress and its relaxation. The latter is notably on account of the fact that inner layers were able to relax before outer layers were added.

Apart from the earlier mentioned resin requirements, the materials employed in carrying through the present invention are not especially critical. The matrix material is a thermosetting polymer, preference being given to epoxy resins. It is of advantage to incorporate compounds into the matrix material which will render it flame-resistant, such as phosphorus or halogen-(particularly bromine-) containing compounds.

An example of a suitable epoxy resin is one built up from 36.5 parts by weight of epoxidated tetrabromo bisphenol-A, 33.5 parts by weight of cresol novolak EPIKOTE® available from Shell Chemical Corp., Houston Tex. 30.5 parts by weight of a solid bisphenol A bisepoxide, and as a hardener 3 parts by weight of MDA (methylene dianiline) in conjunction with 0.5 parts by weight of BF3 MEA (mono ethyl amine) complex. In the uncured form, this resin has a Tg=Tm=Ts of about 35° C. to 45° C. Hence, fibres can be impregnated with this resin at a temperature of about 50° C., and preferably several tens of degrees higher for the sake of faster impregnation, i.e. 100° C. and a non-flowable UD composite can be produced by cooling down to room temperature. Curing can be initiated by activating the hardener, which is done by heating to a temperature above 170° C. under non bulk-flow conditions (in an autoclave, isobarically).

With respect to the addition of flame-retardancy rendering compounds, notably bromine compounds, it is further noted that in view of their detrimental effect on the environment, such compounds should be used in minimal quantities. The process according to the invention is advantageous in this respect in that it allows for the various layers in the laminate to be put together in such a way that only the outer layers are substantially flame-resistant, which is sufficient to prevent the laminate from catching fire. Such a step may also be taken in the case of multilayer PWBs.

To the matrix material fillers may be added in the conventional manner, for instance quartz powder and glass powders such as boron-silicate glass powder, or hollow spheres made from polymer, glass, or ceramics. Furthermore, the matrix may be rendered catalytic for electroless copperplating, e.g. by adding noble metal or compounds of noble metal, notably palladium.

While the preferred reinforcing material consists of filament yarns (untwisted strands), non-continuous fibres may also be employed. According to the invention, the reinforcing yarns are preferably selected from the following group of materials: glass, e.g. E-glass, A-glass, C-glass, D-glass, AR-glass, R-glass, S1-glass, and S2-glass, as well as various ceramic materials, such as alumina and silicon carbide. Also suited to be used are polymer based fibres, more particularly so-called liquid-crystalline polymers, such as paraphenylene terephthalamide (PPDT), polybenzobisoxazole (PBO), polybenzobisthiazole (PBT), and polybenzoimidazole (PBI), as are fibres based on polyethylene naphthalate (PEN), polyethylene terephthalate (PETP), and polyphenylene sulphide (PPS).

In general, the fibre content in the matrix is about 10–90 vol. %, preferably in thy range of about 40 to about 70 vol. %. A fibre volume fraction of about 50 vol. % is highly satisfactory.

In addition, the method according to the invention permits the manufacture in a comparatively inexpensive manner of PWBs with a thin core layer. It is customary to make use of substrates reinforced with thin woven fabrics to this end. For instance, a thin core substrate having a thickness of 100 μm is commonly made from a resin reinforced with two layers of "Style 108" glass fabric having a surface weight of 1.4 ounce/square yard. Such thin woven fabrics are made from 5.5 tex textile glass yarn, which generally costs about 10 times as much as a 136 tex roving. According to the invention, it is possible to use such a comparatively inexpensive 136 tex roving to obtain a thin core laminate. It should be noted in this connection that fibre-reinforced PWB substrates may be distinguished by their thickness factors (T-factor), T being defined as the ratio of the substrate thickness in μm to the average linear density of the yarn (in tex). The invention provides laminates having a T-factor of less than 5.5. This advantage is associated with the process described hereinbefore, since the use of a pre-formed, non-flowing UD composite makes it possible to retain a high degree of spread, for instance as achieved with the aid of a convex feeding zone, as a result of the at least partial consolidation.

The invention also relates to multi-layer PBWs (MLBs). In particular, the composite laminates according to the invention are very suited to be used in the process as specified in non-prepublished international patent application PCT/EP 92/01133 (publication number WO 92/22192) which is to be considered incorporated herein by reference. According to this process, a hard base substrate provided with traces on both sides is laminated with an intermediate substrate, such that the intermediate substrate is composed of a hard core layer with a still plastically deformable adhesive layer at least at the side facing the conductive traces of the base substrate, and such a pressure is exerted on the laminate as will bring said hard core layer of the intermediate substrate into contact, or virtually into contact, with the conductive traces of the base substrate and fill the void between these traces with the adhesive material which bonds the base substrate and the intermediate substrate together. The composite materials according to the invention are highly suitable for use in the base substrate as well as the intermediate substrate. Thus, the invention also pertains to the use of a composite laminate made by a method according to the foregoing description for manufacturing an adhesive-coated insulating panel.

Of course, the void-filling, flowable, adhesive layer can be applied onto the present laminates whenever desired. However, the method described hereinbefore, by which an adhesive layer may advantageously be provided on a composite laminate, is pre-eminently suited to be used for the manufacture of the intermediate substrates provided with the void-filling adhesive. Preference is given to the base substrate provided with traces being a PWB which was also made by the process according to the invention. A large number of polymers is suitable for use as a trace-filling glue, more particularly thermosets, such as epoxy resin (EP), polyurethane (PU), vinyl ester (VE), polyimide (PI), bismaleimide (BMI), biscitraconimide (BCI), cyanate esters, triazines, acrylates, and mixtures thereof. A wide range of additives may be added to the glue prior to its application, for instance catalysts, inhibitors, foaming agents, surface-active agents, thixotropic agents, and especially fillers. Said fillers are preferably selected from the following group of materials: quartz powder, glass powder, ceramic powders such as alumina powder. Preferably, the fillers to be used should have a low thermal coefficient of expansion and a low dielectric constant. Favourable results can be attained by using hollow spheres as filler, which spheres may be of either a polymeric or a ceramic material or of glass. Expandable polymeric powders in particular are suitable for use as filler.

In contradistinction to woven fabric-reinforced laminates, the composite laminates manufactured using the process according to the invention are also suited to be used in a flexible panel or laminate and in rigid-flex laminates. Woven fabrics when used in a flexible panel undergo cracking at the junctions of warp and weft fibres, due to the fact that fibres oriented in the bending direction are interwoven with fibres perpendicular to the bending direction, this adverse effect being enhanced by the high fibre concentration at these junctions, which leads to cracking at a relatively low extent of bending. Such cracks cause a high concentration of stress in the conductive traces present on the flexible laminate, and consequently a high risk of cracking, which leads to circuit breakage. In a flexible laminate (or in the flexible portion of a rigid-flex laminate) the orientation of the outer UD layers preferably parallels the desired bending direction. The process of the invention is excellently suited to be used for the manufacture of such a flexible laminate, as it readily permits the not yet consolidated matrix material-containing fibres applied last to be oriented in the desired bending direction (in other words: it is preferred that, when applying the outer layers of fibres, the production direction be the same as the desired bending direction).

In addition, the composite laminates manufactured using the process according to the invention are pre-eminently suited to be used as supporting material in devices with various integrated circuits provided thereon (multichip modules). This is notably due to the favourable TCEs, which are mostly the result of the high fibre volume fraction that can be obtained when cross-ply laminates are used, and which may be closer to the TCEs of electronic components (chips) used in conjunction with PWBs, more particularly MLBs, than is the case with woven fabric-reinforced laminates. Such components may be provided on top of an MLB (chip-on-board) or else be provided embedded in a substrate such as an intermediate substrate according to WO 92/01133 (chip-in-board). Further, the process according to the invention, and the composite laminates manufactured using it, may be employed in so-called mass lamination (masslam). This process generally comprises a layer provided on both sides with electrically conductive traces being laminated with prepreg and copper foil on the sides provided with the traces. According to the invention, use may be made with advantage, in continuous operation or not, of the masslam process, in which a layer provided with electrically conductive traces on both sides is passed through the laminating zone instead of—or in combination with—the preformed, non-flowing composite, and provided on either side with a layer of UD fibres-containing matrix material, especially when using a double belt press. In a subsequent laminating step, the PWB provided with UD layers thus manufactured may be laminated anew with UD layers, this time of opposite orientation, as essentially described hereinbefore.

In multilayer PWBs that are combined with integrated circuits it may be desired to incorporate capacitors. Viz., integrated circuits, which constantly switch on and off, require bypass capacitors between their power and ground pins in order to reduce switching noise. These bypass capacitors have typical values of 10 to 100 nF and are commonly placed close to the chips. Incorporation into the PWB has advantages such as cost reduction by virtue of the elimination of all components on the bottom side, increased performance by virtue of the inductance in the capacitor leads being avoided, and less electromagnetic interference. In order to achieve a high capacitance, say 1 $nF/in^2$ using a dielectric of 4 mil thickness, a dielectric constant of 20 or higher is required. In order to achieve such a dielectric constant, particles of compounds having a high capacitance, such as $BaTiO_3$, can be incorporated into the matrix resin, or the adhesive layer, of the MLBs according to the invention. It should be noted that it is desired for such particles, which are added in a high volume percentage (e.g 50%) need to form a semi-continuous medium. While this is not very well possible in fabric-reinforced laminates, it can be advantageously realised in laminates reinforced with UD filaments.

The invention will hereinafter be explained with reference to the Example. The Example is explanatory, not limiting.

EXAMPLE

A UD crossply PWB laminate is prepared using the equipment depicted in the schematic drawing.

The figure shows a cross-section parallel to the machine direction of a device with which the process according to the present invention may be carried out. A description of the process's depicted mode of use, together with the device's component parts, is given below. The operation is conducted symmetrically, in a vertically placed double belt press.

A resin formulation is made by feeding 36.5 parts-by-weight of epoxidized tetrabromobisphenol-A, 33.5 parts-by-weight of cresol-novolak epoxy, and 30.5 parts-by-weight of solid bisphenol-A bisepoxide, and mixing and heating up to 120° C. so as to obtain a homogeneous mixture. Then 0.5 parts-by-weight of a $BF_3$ MEA (mono ethylamine) complex are mixed with the heated homogeneous mass, and subsequently 36.0 parts-by-weight of DDS (diamino diphenyl sulphone) are added. The resin mixture has a Tm (Tg) of about 35°–40° C. Above 70° C. it is clearly fluid.

By means of a coating unit (6) a film (7) of the heated resin mixture is coated onto a process belt (8) of a double belt press. The resin solidifies on said belt.

Packages (2) unwind from two creels (1), preferably by rolling, and so form a unidirectional bed of filament bundles (3), which is converter into a homogeneous unidirectional filament bed (5) with the aid of a yarn spreader (4). The UD filaments bed then is laid onto the solidified resin coat (7).

The process belt provided with solidified resin coat (7) and UD filament bed (5) is then run through an IR oven (11). The resin and the UD filaments are heated up to about 150° C. as a result of the IR irradiation, so that fast impregnation of the UD filaments with the resin occurs. In this indirect heating process, while the resin and filaments are irradiated, the belt is not substantially heated. After about 5 seconds, the UD filament bed is fully impregnated. The two thus formed heated matrix-impregnated UD filament layers (12) are brought together and then pass through the laminating zone (13), where they are brought into close contact and fuse together to form a single layer. By being kept tensioned (in the conventional manner) the UD filaments do not lose their parallel, unidirectional orientation. In the laminating zone (13) the warm laminated product is directly cooled to room temperature and, consequently, the resin solidifies. The thus formed non-flowing UD composite leaves the double belt press as a virtually continuous band (15). This band is cut up (16) and stored (e.g., in a box or on a pallet) (17).

The same actions as described above are carried out, up to the introduction of the impregnated UD fibres into the laminating zone (13), except that the resin is not applied directly onto the process belt, but onto a layer of copper foil (9) unwound from a leaving stand (10).

From a box (19) panels of the non-flowing UD composite rotated 90° vis-a-vis the machine direction (20) are guided through the laminating zone (13), such that the panels are provided on either side with impregnated UD fibres (12), the orientational direction of the UD fibres in the panels (18) thus being perpendicular to the orientation of the impregnated UD fibres (12). The parallel orientation of the UD filaments in the non-flowing UD composite (20) is retained by virtue of the fact that only the newly added UD layers are heated, and cooling takes place as soon as these UD layers are joined with the non-flowing composite. I.e., the non-flowing composite as a whole is not heated up to above the resin's Tm (non bulk-flow conditions).

Thus a Cu-clad non-flowing cross-ply laminate having a thickness of about 270 μm is formed.

As a consequence of the resin chosen, the resulting crossply laminate is non-flowing by virtue of the resin being solidified. The conversion of the resin is between 0 and the gelation point. Full conversion is obtained as follows. The formed endless Cu-clad crossply laminate is cut and stacked to form a pile of about 25 mm. This stack is put into a vacuum bag, with flat steel plates on the top and at the bottom. After evacuation, the temperature is slowly raised to 200° C., at a rate of 1° C. /min. After being held at 200° C. for 10 minutes, the stack is cooled to room temperature at a rate of 5° C. /min. The heating leads to the resin becoming irreversibly cured (crosslinked). Again non bulk-flow conditions apply (here even as a result of two measures either of which would have sufficed on its own, viz. slow heating so as to constantly keeps the temperature below Tm (which increases with increasing conversion), and the use of isobaric conditions in the oven.

What is claimed is:

1. A method of making a composite laminate comprising the steps of providing unidirectionally oriented parallel fibres (UD filaments) with a resin matrix to form a UD layer and laminating a plurality of UD layers to form a crossply laminate, wherein the UD filaments are impregnated with an uncured thermosetting resin which solidifies below a certain temperature (Tm), the impregnation being conducted at a temperature above Tm, whereupon the UD filaments-containing resin is cooled in an uncured state to a temperature below Tm to produce said composite UD layer, the produced composite UD layer being irreversibly cured before, during, or after lamination, which lamination is conducted under non bulk-flow conditions.

2. A method of making a composite laminate comprising the steps of providing unidirectionally oriented parallel fibres (UD filaments) with a resin matrix to form a UD layer and laminating a plurality of UD layers to form a crossply laminate, wherein the UD filaments are impregnated with an uncured thermosetting resin which solidifies below a certain temperature (Tm), the impregnation being conducted at a temperature above Tm, whereupon the UD filaments-containing resin is cooled in an uncured state to a temperature below Tm to produce said composite UD layer, the resin being heated to above Tm with non-contact heating means.

3. The method of claim 2, wherein the non-contact heating means is an IR radiation source.

4. A method of making a composite laminate comprising the steps of providing unidirectionally oriented parallel fibres (UD filaments) with a resin matrix to form a UD layer and laminating a plurality of UD layers to form a crossply laminate, wherein the UD filaments are impregnated with an uncured thermosetting resin which solidifies below a certain temperature (Tm), whereupon the UD filaments-containing resin is cooled in an uncured state to a temperature below Tm to produce said composite UD layer, the filaments being impregnated with the resin matrix by coating a process belt or metal foil with solid resin, laying the UD filaments onto the resin, and heating the resin to a temperature above Tm.

5. The method of claim 1 wherein the resin matrix is a latent-curing resin matrix.

6. The method of claim 4 wherein the resin is heated above Tm with non-contact heating means.

7. The method of claim 6, wherein the non-contact heating means is an IR radiation source.

8. A method of manufacturing a composite laminate, wherein unidirectionally oriented (UD) filaments are impregnated with matrix material and passed through a laminating zone in layers of at least two different orientational directions of the filaments, and the matrix material is irreversibly cured after a final laminating step, wherein the UD filaments impregnated with matrix material are passed through the laminating zone together with a pre-formed, non-flowing UD composite, the matrix material being an uncured thermosetting resin which solidifies below a certain temperature (Tm), the non-flowing UD-composite being formed by cooling the UD filaments-containing resin in an uncured state to a temperature below Tm, and the UD filaments impregnated with matrix material being passed through the laminating zone under nonbulk-flow conditions.

9. The method of claim 8, wherein in a first step a non-flowing UD composite is formed by passing UD filaments provided with not yet consolidated matrix material through a double belt press and cooling the matrix material to a non-flowing state, while in a second step a measured portion of the pre-formed, non-flowing UD composite is introduced into the double belt press, and this composite is laminated with UD filaments-containing, not yet consolidated matrix material.

10. The method of claim 9, wherein in the double belt press which is alongside of the two outer surfaces of the non-flowing UD composite, there is introduced not yet consolidated matrix material provided with UD filaments having an orientational direction which is about perpendicular to the orientational direction in the UD composite.

11. A method of making a printed wire board (PWB) comprising making a composite laminate by the method of claim 1 and further comprising rendering at least one outer surface of the composite laminate suitable for the application of traces of electrically conductive material.

12. The method of claim 11, wherein a foil of a metal suitable for the subtractive forming of conductive traces is laminated on the outer sides of the UD filaments-containing matrix material passed through the laminating zone.

13. The method of claim 12, further comprising, after passing through the laminating zone, the step of coating the composite laminate on the outer sides with a base layer to promote the adhesion of electrolessly deposited copper traces.

14. The method of claim 1 further comprising rendering the composite laminate suitable for the manufacture of multi-layer PWBs by coating, downstream of the laminating zone, its outer sides with an adhesive layer which still can be brought to flow.

15. The method of claim 1 wherein curing is performed during or after lamination, the curing leading to an increasing softening point (Ts) of the resin, the curing being conducted by applying a gradually increasing temperature that is constantly kept about 5–10 K below Ts as long as the gel point has not been reached.

16. A composite laminate suitable for making a substrate for a printed circuit (a PWB) said composite laminate having at least one outer surface has been rendered suitable for the deposition of traces of conductive material, the composite laminate comprising a said uncured matrix material reinforced with the unidirectionally oriented filaments such that the UD reinforcing filaments are present in different layers of crossing orientational directions, said layers being symmetrically positioned vis-avis a plane of symmetry through the centre of the laminate which runs parallel to its outer surfaces, wherein the matrix material is used to impregnate the UD reinforcing filaments in an uncured melted form, the matrix material being an irreversibly curable thermosetting resin which in the uncured form is solid at ambient temperature and flowable when heated.

17. A multilayer PWB comprising at least three layers of conductive material and at least two layers of uncured insulating material characterised in that cross-ply laminates manufactured using the process of claim 11 are used as insulating material.

18. The multilayer PWB of claim 17, wherein the insulating material comprises a dielectric constant increasing filler.

19. The multilayer PWB of claim 18, wherein the resin matrix comprises $BaTiO_3$ particles.

20. The multilayer PWB of claim 17, further comprising dielectric layers coated with an adhesive layer which still can be brought to flow, wherein the adhesive layer comprises $BaTiO_3$ particles.

* * * * *